United States Patent [19]

Sandhu et al.

[11] Patent Number: 5,236,865
[45] Date of Patent: Aug. 17, 1993

[54] METHOD FOR SIMULTANEOUSLY FORMING SILICIDE AND EFFECTING DOPANT ACTIVATION ON A SEMICONDUCTOR WAFER

[75] Inventors: Gurtej S. Sandhu; Trung T. Doan; Chang Yu, all of Boise, Id.

[73] Assignee: Micron Technology, Inc., Boise, Id.

[21] Appl. No.: 900,557

[22] Filed: Jun. 18, 1992

Related U.S. Application Data

[63] Continuation of Ser. No. 642,029, Jan. 16, 1991, abandoned.

[51] Int. Cl.$^5$ ................... H01L 21/268; H01L 21/441
[52] U.S. Cl. ..................................... 437/174; 437/195; 437/200
[58] Field of Search ............... 437/192, 193, 173, 174, 437/195, 200; 148/DIG. 147, DIG. 93, DIG. 83

[56] References Cited

U.S. PATENT DOCUMENTS

| | | | |
|---|---|---|---|
| 4,617,723 | 10/1986 | Mukai | 437/192 |
| 4,830,971 | 5/1989 | Shibata | 148/DIG. 19 |
| 4,924,294 | 5/1990 | Tanielian | 437/192 X |

OTHER PUBLICATIONS

"Shallow Junction Diode Formation by Implantation of Arsenic and Boron Through Titanium-Silicide Films and Rapid Thermal Annealing" by Rubin, et al., IEEE Transactions on Electronic Devices, vol. 37, No. 1, Jan. 1990, pp. 183-190.

"The Application of Ion Beam Mixing, Doped Silicide, and Rapid Thermal Processing to Self-Aligned Silicide Technology" by Ku, et al., Journal of the Electrochemical Society, vol. 137, No. 2, Feb. 1990, pp. 728-740.

"Silicon Processing for the VLSI Era" by Wolf, Published by Lattice Press (Dec. 1990), vol. 2, pp. 143-152.

"Silicon Processing for the VLSI Era, vol. 2 Process Integration" by Wolf, Published by Lattice Press (Dec. 1990) pp. 255-256.

"Microchip Fabrication" by Van Zant, Published by Semiconductor Services, San Jose, CA (Dec. 1986), p. 173.

*Primary Examiner*—John S. Maples
*Attorney, Agent, or Firm*—Wells, St. John, Roberts, Gregory & Matkin

[57] ABSTRACT

A method for forming silicides while simultaneously activating underlying silicon substrate active regions eliminates the need for separate annealing of the active region following ion-implantation procedures. The required energy for such simultaneous processing is provided by laser irradiation directed to the surface of a wafer after blanketing it with a layer of the metal desired in the silicide.

6 Claims, 4 Drawing Sheets

METHOD FOR SIMULTANEOUSLY FORMING SILICIDE AND EFFECTING DOPANT ACTIVATION ON A SEMICONDUCTOR WAFER

RELATED PATENT APPLICATION DATA

This patent resulted from a continuation application of U.S. patent application Ser. No. 07/642,029, filed Jan. 16, 1991 which which was abandoned.

TECHNICAL FIELD

This disclosure relates to production of contact structures and implanted active regions in semiconductor wafer processing. It specifically pertains to improvements in the formation of silicide and in the activation of implanted active regions within a silicon substrate.

BACKGROUND OF THE INVENTION

Conventional fabrication of wafers in very large scale integrated circuit production processes involves use of ion implantation, followed by an annealing step. A post-implant anneal is utilized to activate the ion-implanted dopants in the selected active silicon regions. Typical anneal processes take place at 1000° C. in a nitrogen atmosphere.

Laser pulse annealing is another method reportedly used in activating the dopants. Rapidly pulsing the wafer surface to the required temperature is stated to restore the crystal structure of the substrate without causing juncture movement.

As device dimensions in MOS integrated circuits are scaled down, the parasitic resistance of the diffused regions becomes more significant relative to that of other resistances in the circuit, such as the resistance of the inversion layer. This happens because a reduction of the size of device-dimensions by a factor of S results in a proportional reduction of the length of a diffused region, whereas its cross-sectional (thickness × width) area is reduced by an amount proportional to the square of S. The parasitic resistance increases thus by a factor of S. This increase adversely affects device operation because ohmic heat dissipation scales linearly with the resistance and is hence augmented by a factor of S as well. Similarly, the RC time delay of the signal propagation within the circuit is multiplied by a factor S. Because of this increase in parasitic resistance, thin films of silicide compounds are used as a way of lowering the sheet resistivities of the diffused regions and the polysilicon lines. Titanium silicide ($TiSi_2$) is the most promising material for this purpose because it has the lowest bulk resistivity of the transition metal silicides. Additionally, it is relatively easy to form uniform thin films of this material on silicon either by co-deposition or silicidation.

Recently, the self-aligned silicide (or salicide) process has become widely used in MOS technology. After the gate, source, and drain active regions have been formed in the silicon, sidewall spacers are formed adjacent to the polysilicon lines. This is to prevent gate-to-source or gate-to-drain shorting that would otherwise occur by allowing silicide on the source and drain regions to contact silicide on the polysilicon gate. Titanium is then deposited on the wafer and is thermally reacted to form a silicide. In this process, silicide is formed only where the titanium contacts silicon (i.e., on the diffused regions and the polysilicon lines). The unreacted Ti can then be selectively removed from the other areas by using an etching solution of hydrogen peroxide, and ammonium hydroxide, leaving conducting films of silicide only where they are needed. Because the sheet resistivities of the silicided regions are very low, it is possible to connect devices in the circuit over longer distances using silicided polysilicon instead of metal lines. Thus, the silicide acts to some extent as an additional interconnect layer. Since fewer connections are formed by the metallization, the die area devoted to metal lines (and thus the total die area as well) can be reduced, lowering the cost per die.

In current salicide schemes, the Ti is deposited after the source-drain regions have been implanted and annealed. When silicide is formed on these regions, a portion of the heavily doped junction is consumed as the $TiSi_2$ interface moves into the silicon while the reaction progresses. The amount of silicon consumed (typically 800-1000 Angstroms) is almost comparable to the junction depths of current devices. As the device dimensions shrink, the junction depths must be scaled down accordingly. The diffusion of dopants both laterally and vertically must be controlled to minimize short channel and other undesirable effects. As junction depths are lowered, the variation in the amount of silicon consumed by the silicide makes it increasingly more difficult to achieve proper final junction depth.

With shrinking device geometries, silicidation after defining the active silicon regions in the integrated circuits being produced on a semiconductor wafer is becoming increasingly impractical because of the lack of control of the silicon layer thickness consumed during the silicidation process. The silicides can sometimes extend through the entire active region, thereby shorting the resulting devices.

The present process was developed to provide greater control of the processing requirements involved in the production of silicide, while also reducing the number of process steps required to complete formation of active regions on a silicon wafer substrate. This is accomplished by simultaneously forming silicide and effecting dopant activation by use of laser irradiation.

BRIEF DESCRIPTION OF THE DRAWINGS

The preferred embodiment of the invention is illustrated in the accompanying drawings, in which.

DETAILED DESCRIPTION OF THE PREFERRED EMBODIMENTS

The following disclosure of the invention is submitted in furtherance with the constitutional purpose of the Patent Laws "to promote the progress of science and useful arts" (Article 1, Section 8).

Conventional processes relating to formation of silicides and dopant activation after ion-implantation have required four steps. The steps are:
(1) ion-implantation of dopant of the active regions about the integrated circuits being produced;
(2) activation of the dopant by an anneal to minimize implant damage to the substrate;
(3) deposition of a metal layer capable of reacting with the silicon substrate; and
(4) application of heat to cause the metal and silicon to react and form a silicide.

One of the principal problems encountered during such conventional annealing processes is that the implanted atoms tend to diffuse into the silicon substrate, reducing the definition of the active regions desired at its surface. This diffusion is further encouraged by reheating the wafer during formation of silicide. Using separate heating procedures to anneal the implanted regions and to subsequently form silicides also reduces control of the silicon layer thickness consumed during formation of silicides.

Conventional processes for repeatedly heating and reheating semiconductor wafers for these purposes are also very time consuming. Forming silicides in a furnace can require approximately one-half hour to complete the required reaction. Where high intensity light sources are used for heating the metal layer during silicidation processes, the period required can be reduced to approximately 10 to 100 seconds. With the present invention, the application of heat is further reduced to approximately 35 nsec and the need for a separate annealing sequence is totally eliminated.

It is also very important to control thickness of silicide layers. Present technology in semiconductor fabrication utilizes silicide thickness ranges between 1000 to 2000 Angstroms (0.1 microns). It is anticipated that silicide thicknesses of 100 to 200 Angstroms will be required in the foreseeable future.

Figure 1:
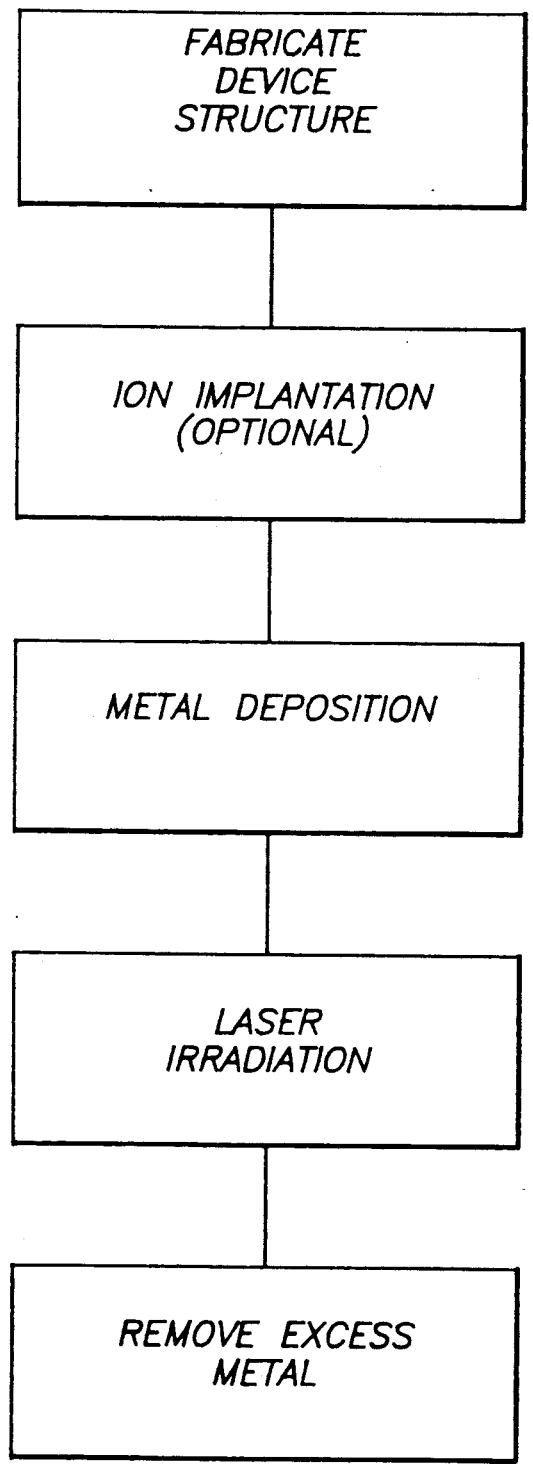
FIG. 1 is a flow diagram of the steps involved in the described process.
Figure 2:
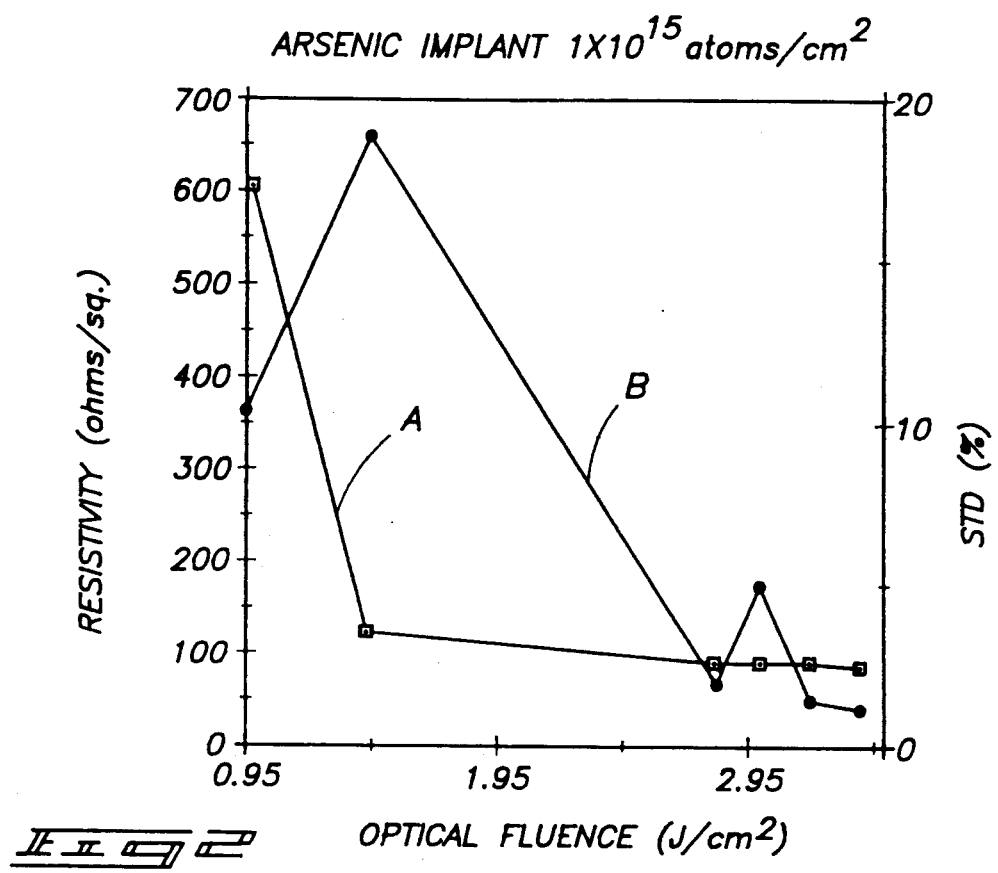
FIG. 2 is a plot of resistivity and Standard Deviation vs. Optical Fluence.
Figure 3:
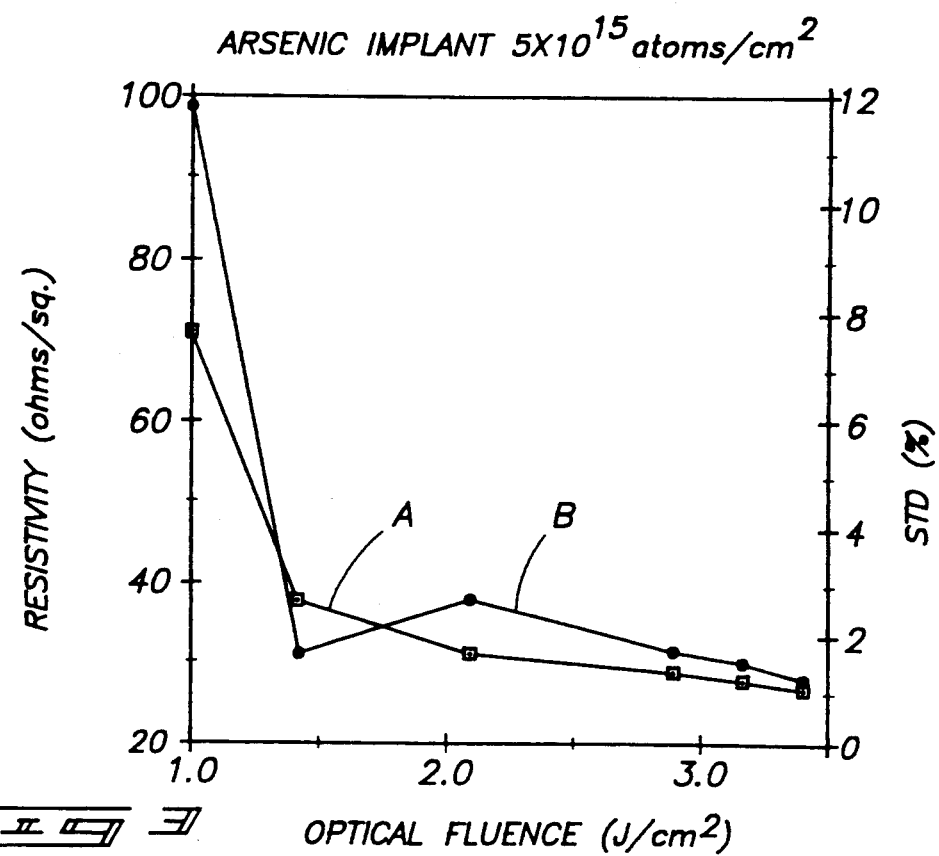
FIG. 3 is a plot of resistivity and Standard Deviation vs. Optical Fluence.
Figure 4:
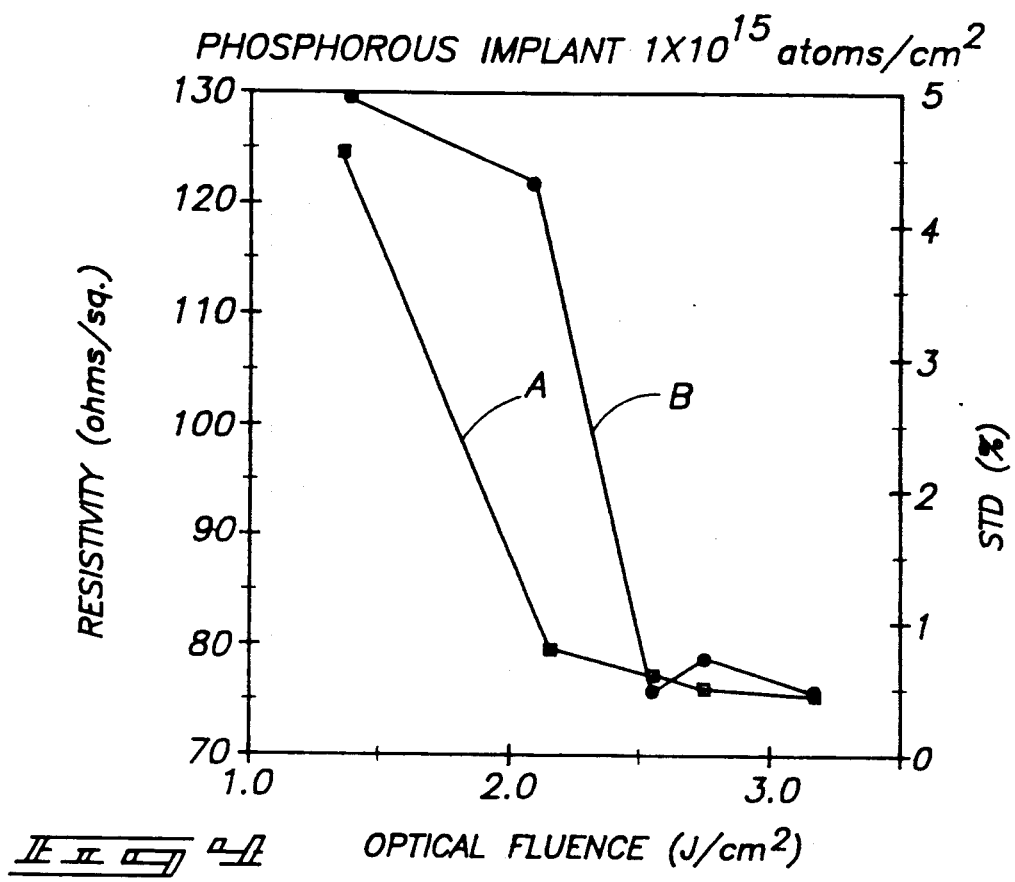
FIG. 4 is a plot of resistivity and Standard Deviation vs. Optical Fluence.
Figure 5:
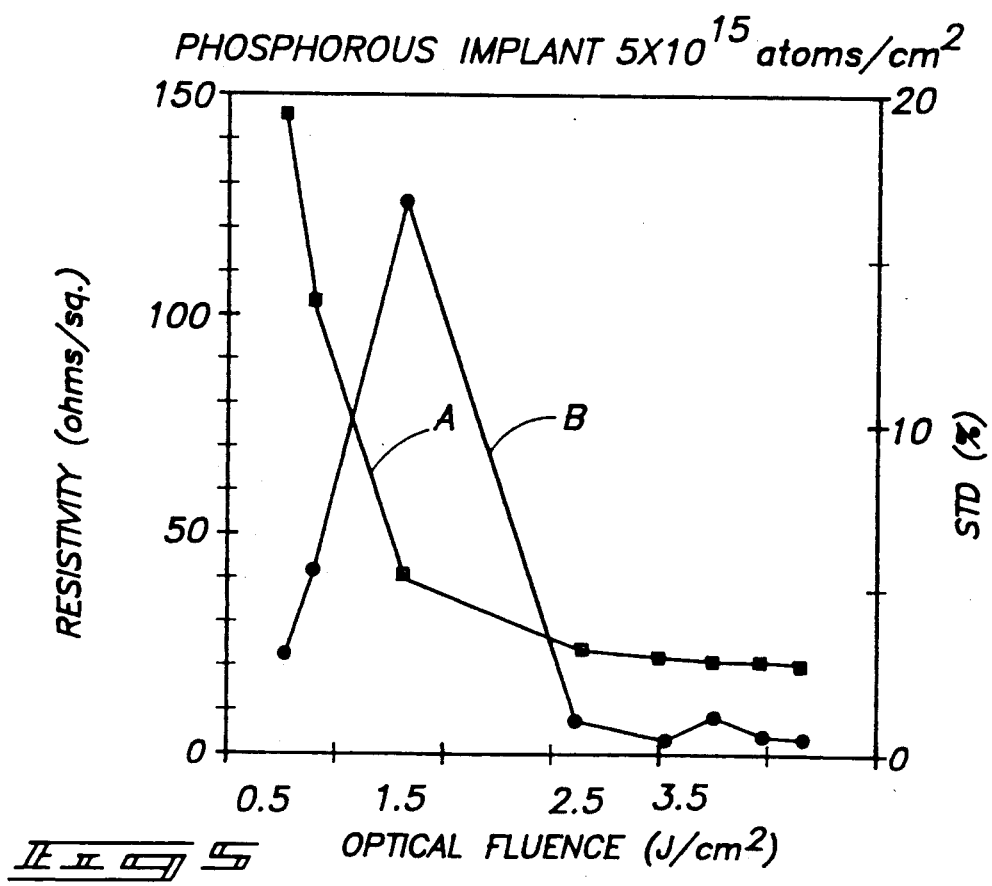
FIG. 5 is a plot of resistivity and Standard Deviation vs. Optical Fluence.

As shown in FIG. 1 of the drawings, the process involves fabrication of a wafer by depositing and patterning different conductive and insulating layers, and by doping silicon areas to begin producing electronic devices and desired integrated circuits on the wafer. Such electronic devices typically have exposed active areas.

Next, ion-implantation of active areas is accomplished, where such implantation is required by the technique being used.

The wafer is then blanketed by a thin film of the metal selected for silicide formation. Such metals are typically refractory metals in Group VIII, such as titanium, platinum, palladium, cobalt, and nickel. Of this group, the two metals most prominently used are titanium and cobalt. The silicides formed from these metals exhibit the lowest resistivities of the group and can withstand process temperatures in excess of 800° C. Titanium is particularly attractive for such applications because it can reduce native-oxide layers, making it possible to reliably form a silicide on both polycrystalline and single batch crystal silicon through a thermal reaction.

The next step involves exposure of the wafer surface to laser irradiation. This can be accomplished by using a conventional excimer laser source repeatedly focused and pulsed about the surface of the wafer until all areas across it have been uniformly heated. Continuously scanning lasers can also be utilized.

The use of laser irradiation furnishes a precisely controllable source of energy for simultaneous dopant activation and silicidation during chip fabrication. Since the thickness of the silicide layer is a function of the total energy available for the promotion of a reaction between the metal and silicon, the precise control of energy application available by use of a laser source enables one to carefully determine the silicide thickness that will result. Application of energy from a laser can be controlled much more precisely than can be application of heat energy from a furnace or other radiation sources. As shown in Table 1, our tests have demonstrated that use of an excimer pulse laser to form $TiSi_2$ produces unmatched control of thickness dimension in resulting silicide films. The results listed in Table 1 were obtained with a starting sample of 500 A of titanium on a silicon substrate. The data listed indicated the thickness of titanium silicide obtained when the coating was exposed to laser pulse of differing energies.

TABLE 1

| Optical Fluence ($J/cm^2$) | Silicide Thickness (Angstroms) |
|---|---|
| 1.18 | 1050 |
| 1.69 | 1020 |
| 2.09 | 1040 |
| 2.65 | 1030 |
| 3.47 | 1040 |

Figure 6:
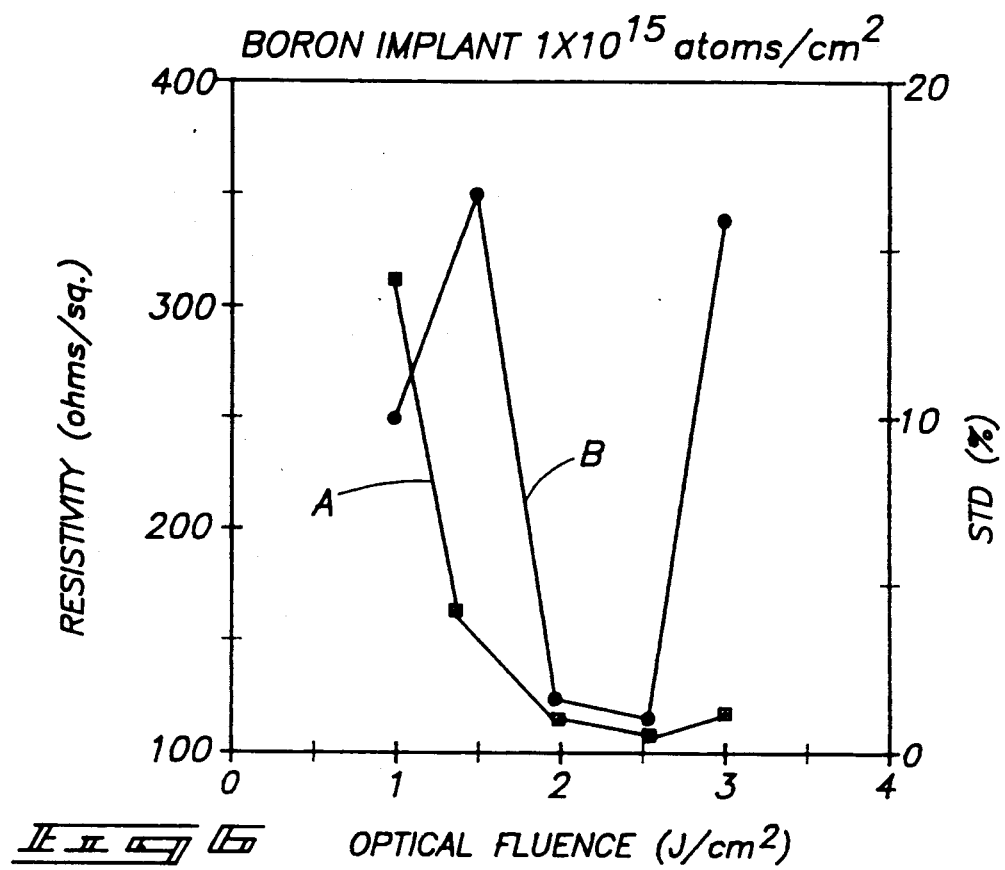
FIG. 6 is a plot of resistivity and Standard Deviation vs. Optical Fluence.
Figure 7:
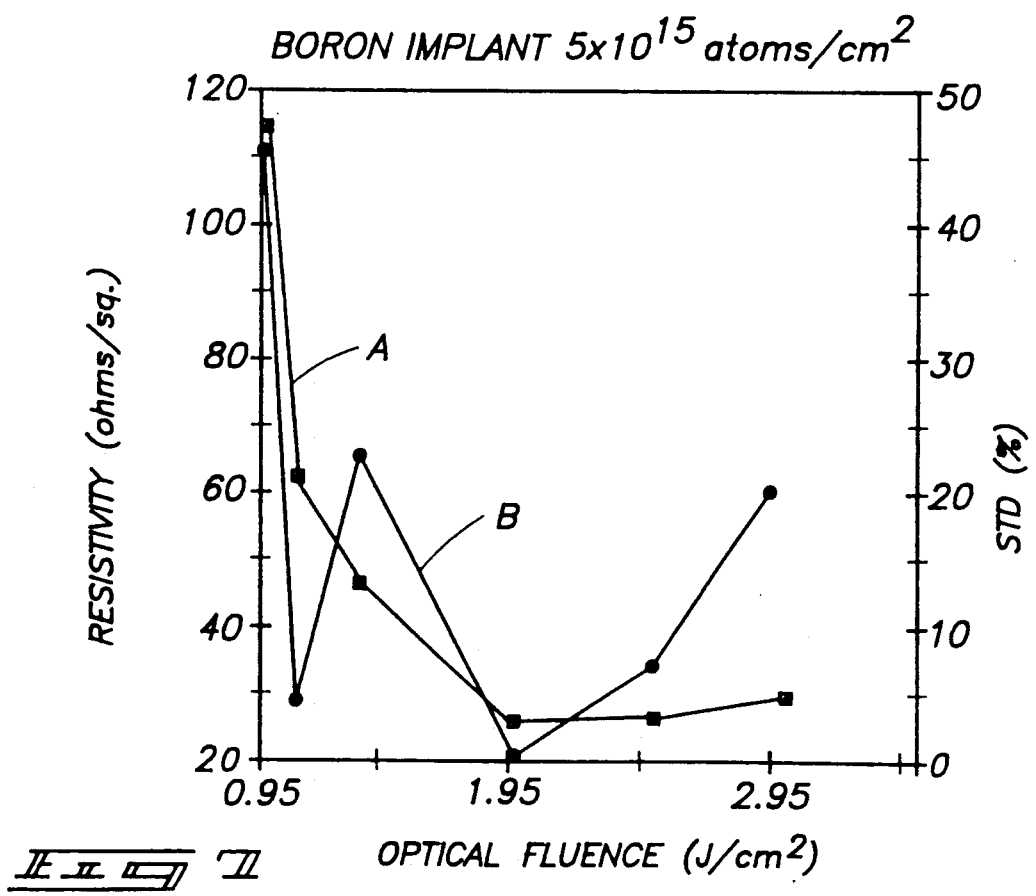
FIG. 7 is a plot of resistivity and Standard Deviation vs. Optical Fluence.

FIGS. 2–7 demonstrate measured test results of resistivity in ohms/sq. (line A) achieved by laser assisted annealing of silicon wafers implanted with arsenic (FIGS. 2 and 3), phosphorous (FIGS. 4 and 5), and boron (FIGS. 6 and 7). In each instance, the resistivity decreased as the laser fluence was increased, indicating electrical activation of the dopant atoms. FIGS. 2–7 also show that very low Standard Deviations in resistivity across the wafer (line B) can be achieved by using this technique.

In addition to producing a silicide, the application of laser energy has been shown to effectively activate the ion-implanted dopant in the underlying active region of the device being fabricated on a semiconductor wafer. Most of the heat generated during exposure of the wafer to the laser energy will flow through the contact holes to the silicon wafer substrate because the thermal conductivity of the surrounding silicon dioxide layer is very low. The thermal energy resulting from application of laser irradiation is effectively utilized to simultaneously form the silicide layer and activate the dopant atoms in the underlying structure of the silicon substrate.

The thickness of the silicide layer and energy directed to activation can be optimized by controlling the application rates and times for the laser irradiation step. This results in achieving desired parameters in the active areas simultaneously with production of the silicide layer.

The final step in the process is to remove the excess metal that has not reacted to form silicide. This blanket etching step is conventional in silicide formation.

Experimental Silicide Formation Results

For a starting sample with 500 A of Ti on Silicon substrate, the thicknesses of Titanium silicide obtained when exposed to laser pulses of different energies are shown in the following table:

TABLE 2

| Optical Fluence (J/cm2) | Silicide Thickness (Angstroms) |
|---|---|
| 1.18 | 1050 |
| 1.69 | 1020 |
| 2.09 | 1040 |
| 2.65 | 1030 |
| 3.47 | 1040 |

The substrate temperature during lasing in all the cases listed in Table 2 was 300° C. The resulting thicknesses of silicide (shown in Table 2) correspond to what is used today in state-of-the-art semiconductor devices.

Experimental Ion Implantation Results

The ion implantation energies used for various implants into Si-substrate are shown in the following table:

TABLE 3

| Ion Species | Energy (keV) |
|---|---|
| B | 20 |
| P | 55 |
| As | 120 |

The low energies shown in Table 3 result in shallow junctions normally used in state-of-the-art devices. The goal of a conventional annealing step is to activate these implanted atoms and achieve low resistivities and standard deviation across the wafer. As shown in FIGS. 2-7, a process window exists to achieve low resistivity and standard deviations less than 2%, through the use of laser energy. The lowering of resistivity with optical fluence is very similar to the trends seen with annealing temperature and time. This indicates that a similar mechanism for activation of the dopant atoms is taking place.

Based on all the experimental work performed on activation of dopants in ion-implanted Si through the use of laser as well as formation of silicide, the following range of experimental conditions were obtained for a successful use of this technique for fabrication of present day state-of-the-art devices.

TABLE 4

| Parameter | Range |
|---|---|
| Substrate Temperature | 300 to 400 C. |
| Optical Fluence | 2.0 to 3.0 J/cm$^2$ |
| Metal Thickness | 300 to 600 Angstroms |
| Implant Dose | 1.0 to 5.0 × 10$^{15}$/cm$^2$ |
| Implant Energy | 20–40 keV Boron |
| | 40–60 keV Phosphorus |
| | 80–120 keV Arsenic |

The advantages of simultaneously forming the silicide and activating the dopant are that it reduces the number of process steps necessary to complete formation of active regions for devices on a wafer by removing the annealing step, it provides a higher degree of control of energy application to the wafer and therefore lends itself to production techniques involving smaller geometries, it enables the process to be performed in a vacuum environment and therefore is much cleaner than furnace annealing, and it requires only a very short duration of irradiation, which minimizes diffusion of the dopant and makes it possible to achieve shallower junction depths.

In compliance with the statute, the invention has been described in language more or less specific as to structural features. It is to be understood, however, that the invention is not limited to the specific features shown, since the means and construction herein disclosed comprise a preferred form of putting the invention into effect. The invention is, therefore, claimed in any of its forms or modifications within the proper scope of the appended claims appropriately interpreted in accordance with the doctrine of equivalents.

We claim:

1. A method for forming silicide and effecting dopant activation in underlying ion implanted active regions of devices on a semiconductor wafer, comprising the following sequential steps:
    selectively fabricating a wafer by depositing and patterning different conductive and insulating layers and by ion implant doping of silicon areas to begin producing electronic devices and desired integrated circuits on the wafer, the electronic devices having exposed ion implanted silicon areas;
    depositing a blanketing layer of metal on the wafer in direct contact with the exposed silicon areas thereby defining metal-silicon interfaces, the blanketing metal layer covering the entirety of the wafer;
    exposing all areas of the blanketing layer of metal to laser irradiation at an application rate and time sufficient to produce a silicide layer at the metal-silicon interfaces while in the same laser exposing step also effecting crystal damage repair occurring as a result of the ion implantation and activation of the ion implanted dopants; and
    removing unreacted portions of the blanketing layer of metal.

2. The method of claim 1, wherein the metal is a transition metal.

3. The method of claim 1, wherein the metal is titanium.

4. The method of claim 1, wherein the metal thickness is 300 to 600 Angstroms, the dopant is boron implanted by ion implantation at energy levels of 20–40 KeV, the implant dose is 1.0 to 5.0×10$^{15}$/cm$^2$, and the wafer is exposed to laser irradiation at a substrate temperature of 300° to 400° C. and an optical fluence of 2.0 to 3.0 J/cm$^2$.

5. The method of claim 1, wherein the metal thickness is 300 to 600 Angstroms, the dopant is phosphorous implanted by ion implantation at energy levels of 40–60 KeV, the implant dose is 1.0 to 5.0×10$^{15}$/cm$^2$, and the wafer is exposed to laser irradiation at a substrate temperature of 300° to 400° C. and an optical fluence of 2.0 to 3.0 J/cm$^2$.

6. The method of claim 1, wherein the metal thickness is 300 to 600 Angstroms, the dopant is arsenic implanted by ion implantation at energy levels of 80–120 KeV, the implant dose is 1.0 to 5.0×10$^{15}$/cm$^2$, and the wafer is exposed to laser irradiation at a substrate temperature of 300° to 400° C. and an optical fluence of 2.0 to 3.0 J/cm$^2$.

* * * * *